United States Patent
Zolfaghari

(10) Patent No.: US 7,436,253 B2
(45) Date of Patent: Oct. 14, 2008

(54) METHOD AND SYSTEM FOR FAST CALIBRATION TO CANCEL PHASE FEEDTHROUGH

(75) Inventor: Alireza Zolfaghari, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 78 days.

(21) Appl. No.: 11/616,689

(22) Filed: Dec. 27, 2006

(65) Prior Publication Data

US 2008/0136511 A1    Jun. 12, 2008

Related U.S. Application Data

(60) Provisional application No. 60/868,818, filed on Dec. 6, 2006.

(51) Int. Cl.
*H03F 3/68* (2006.01)
(52) U.S. Cl. .......................................... 330/2; 330/295
(58) Field of Classification Search ................ 330/2, 330/9, 51, 124 R, 136, 295
See application file for complete search history.

(56) References Cited

U.S. PATENT DOCUMENTS

| | | | | |
|---|---|---|---|---|
| 4,881,042 A | * | 11/1989 | Min et al. | 329/326 |
| 2002/0008575 A1 | * | 1/2002 | Oskowsky et al. | 330/51 |
| 2006/0067427 A1 | * | 3/2006 | Zolfaghari et al. | 375/297 |

* cited by examiner

*Primary Examiner*—Robert J. Pascal
*Assistant Examiner*—Khiem D Nguyen
(74) *Attorney, Agent, or Firm*—McAndrews Held & Malloy Ltd.

(57) ABSTRACT

Methods and systems for fast calibration to cancel phase feedthrough are disclosed and may comprise individually activating each of n binary-weighted cells utilizing a control signal in a power amplifier driver (PAD) and measuring the output signal, or offset, in response to a null signal applied to an input of each binary-weighted cell. This offset may be fed back, summed, and adjusted until the measured PAD output may be minimized. This calibrated offset may cancel phase feedthrough of the PAD, and the calibrated offset for each binary-weighted cell may be stored in a lookup table. The control signal may also be utilized for controlling the output power of the PAD by activating appropriate binary-weighted cells. For each of the $2^n$ output powers, a calibrated offset is calculated utilizing a weighted sum of the stored offsets for the activated binary-weighted cells.

30 Claims, 5 Drawing Sheets

METHOD AND SYSTEM FOR FAST CALIBRATION TO CANCEL PHASE FEEDTHROUGH

CROSS-REFERENCE TO RELATED APPLICATIONS/INCORPORATION BY REFERENCE

This application makes reference to, claims priority to, and claims the benefit of U.S. Provisional Application Ser. No. 60/868,818, filed on Dec. 6, 2006.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication transmitters. More specifically, certain embodiments of the invention relate to a method and system for fast calibration to cancel phase feedthrough.

BACKGROUND OF THE INVENTION

A power amplification circuit in a wireless system is typically a large signal device. In wireless local area network (WLAN) systems, the power amplifier circuit may transmit output signals at average power levels in the range of 10 dBm to 20 dBm, and peak power levels of about 20 to 30 dBm, for example. In such WLAN systems, which may, for example, utilize a wide range of modulation types from binary phase shift keying (BPSK) to 512 level quadrature amplitude modulation (512-QAM), output power levels may vary widely such that the ratio of the peak power level to the average power level may be large, for example, 10 dBm to 15 dBm. Because of these large swings in output power levels, power amplifier (PA) circuits may distort the output signal. Distortion, however, is a characteristic, which may be observed in PA circuits that are utilized across a wide range of applications, and may not be limited to PA circuits utilized in wireless systems. There are two metrics, which may be utilized to evaluate the distortion performance of PA circuits. These metrics may be referred to as amplitude modulation to amplitude modulation (AM-AM) distortion, and amplitude modulation to phase modulation (AM-PM) distortion.

The AM-AM distortion provides a measure of the output power level, $P_{out}$, in response to the input power level, $P_{in}$. The input power level, and output power level are each typically measured in units of dBm, for example. In an ideal, nondistorting, PA circuit, the output power level changes linearly in response to a change in the input power level. Thus, for each $\Delta P_{in}$ change in the input power level there may be a corresponding change in the output power level, $\Delta P_{out} \approx \alpha \Delta P_{in}$, where $\alpha$ represents a constant of linearity. The AM-AM distortion may be observed when, for example, the change in the output power level in response to a first change in input power level may be $\Delta^1 P_{out} \approx \alpha \Delta^1 P_{in}$, where the change in the output level in response to a second change in the input power level may be $\Delta^2 P_{out} \approx \beta \Delta^2 P_{in}$, when $\alpha \neq \beta$.

The AM-PM distortion provides a measure of the phase of the output signal in relation to the input signal (or output phase) in response to the input power level. Output phase is typically measured in units of angular degrees. The AM-PM distortion may be observed when, for example, the output phase changes in response to a change in input power level.

Limitations in the performance of PA circuitry due to distortion may be exacerbated when the PA is integrated in a single integrated circuit (IC) device with other radio frequency (RF) transmitter circuitry such as digital to analog converters (DAC), low pass filters (LPF), mixers, and RF programmable gain amplifiers (RFPGA). Whereas the pressing need to increase the integration of functions performed within a single IC, and attendant increase in the number of semiconductor devices, may push semiconductor fabrication technologies toward increasingly shrinking semiconductor device geometries, these very semiconductor fabrication technologies may impose limitations on the performance of the integrated PA circuitry. For example, utilizing a 65 nm CMOS process may restrict the range of input power levels for which the PA provides linear output power level amplification. Requirements for AM-AM and/or AM-PM distortion levels as set forth in a WLAN standard, such as IEEE 802.11, may preclude transmitting output signals at high output power levels for PA circuitry that is fabricated utilizing a 65 nm CMOS process, for example. An exemplary standard for WLAN systems may specify, for example, that the ratio of the AM-AM distortion to output power level not exceed −25 dBm.

One current approach utilized in an attempt to reduce AM-AM distortion and/or AM-PM distortion involves fabricating PA circuitry in discrete IC devices, which are not integrated with other RF transmitter circuitry. The fabrication processes for these IC devices may utilize gallium arsenide (GaAs) and/or gallium nitride (GaN) materials. Silicon (Si), which is a material utilized in CMOS and various other semiconductor fabrication processes offers several advantages in relation to GaAs and/or GaN. First, silicon is a readily available, and inexpensive, material. Second, Si readily bonds to silicon dioxide ($SiO_2$), a commonly utilized insulating layer during semiconductor manufacturing. Third, the integration of other devices with CMOS circuits is simpler in that many circuits are fabricated on Si and thus would have the same thermal mismatch and other mechanical characteristics.

The discrete IC approach imposes its own limitations, however. One such limitation is that by placing the PA circuitry and other RF transmitter circuitry in discrete IC devices, each device may be required to provide external pins that enable interfacing of the discrete devices. Increasing pin count may increase the manufacturing cost of each IC device. Furthermore, additional external circuitry may be required if the interfaces between the discrete IC devices are not compatible. For example, additional external circuitry may be required if the interface from one discrete IC device utilizes single ended input and output (I/O), while the interface from another discrete IC device utilizes differential I/O.

In another current approach utilized in an attempt to reduce AM-AM distortion and/or AM-PM distortion the input power level may be restricted to a narrower range, which may in turn restrict the maximum output power level. One limitation of this approach in wireless communication systems is that restricting the maximum output power level may reduce the range over which a mobile terminal may transmit signals to, for example, a node B element of base transceiver station (BTS) in a wireless network. To the wireless network operator, the reduction in range may require that more node B elements, and/or BTSs be deployed, or risk that wireless network users will experience decreased communications quality, and/or dropped calls when communicating via the network.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY OF THE INVENTION

A system and/or method for fast calibration to cancel phase feedthrough, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for calibrating and using a circuit. Aspects of the invention may comprise individually activating each of n binary-weighted cells in a power amplifier driver (PAD) utilizing a control signal and measuring the output signal, or offset, in response to a null signal applied to an input of the PAD. This offset may be fed back to the input, summed, and adjusted until the measured PAD output may be minimized or as small as possible. This calibrated offset may cancel phase feedthrough of the PAD, and the calibrated offset for each binary-weighted cell may be stored in a lookup table. The control signal may also be utilized for controlling the output power of the PAD by activating appropriate binary-weighted cells. For each of the $2^n$ output powers, a calibrated offset is calculated utilizing a weighted sum of the stored offsets for the activated binary-weighted cells.

Figure 1A:
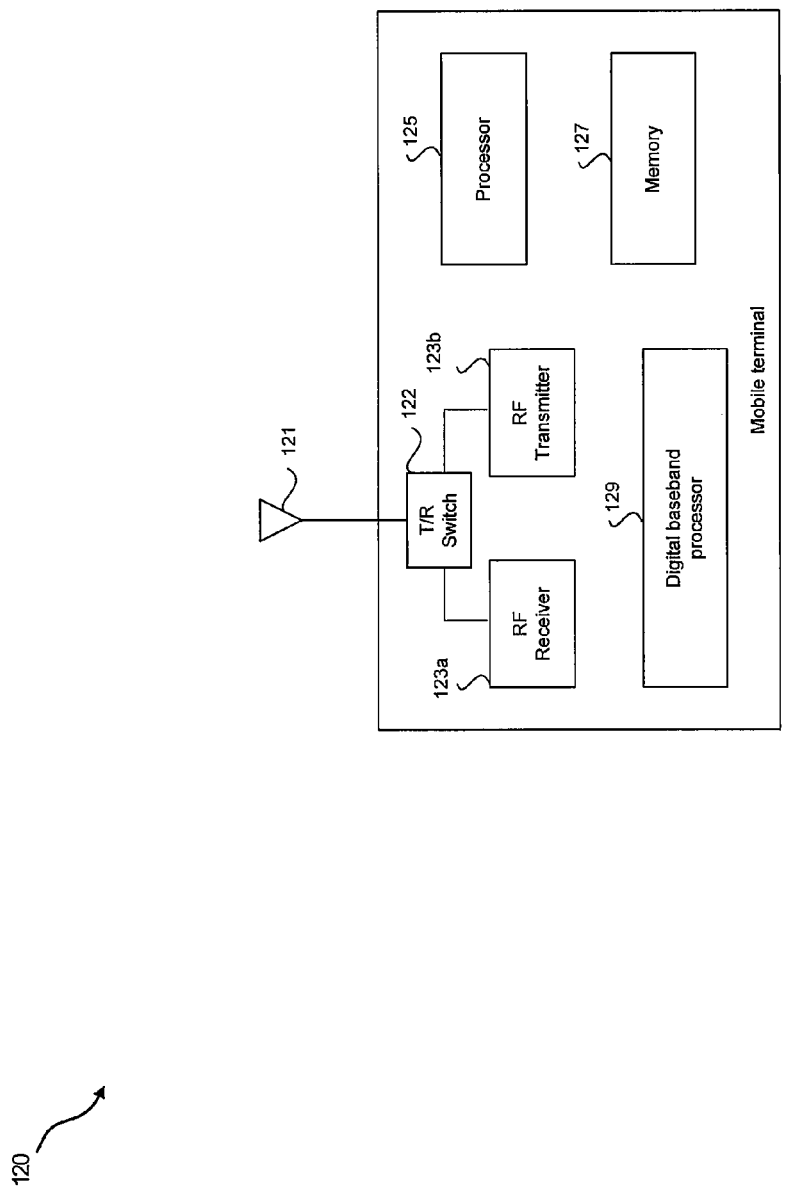
FIG. 1A is a block diagram illustrating an exemplary mobile terminal, which may be utilized in connection with an embodiment of the invention.

FIG. 1A is a block diagram illustrating and exemplary mobile terminal, which may be utilized in connection with an embodiment of the invention. Referring to FIG. 1A, there is shown mobile terminal 120 that may comprise an RF receiver 123a, an RF transmitter 123b, a digital baseband processor 129, a processor 125, a transmit/receive (T/R) switch 122, an antenna 121 and a memory 127. The T/R switch may be communicatively coupled to the RF receiver 123a and to the RF transmitter 123b. In instances when the T/R switch 122 is set to "R", or receive, the antenna 121 may be communicatively coupled to the RF receiver 123a, and in instances when the T/R switch 122 is set to "T", or transmit, the antenna 121 may be communicatively coupled to the RF transmitter 123b.

The RF receiver 123a may comprise suitable logic, circuitry, and/or code that may enable processing of received RF signals. The RF receiver 123a may enable receiving of RF signals in frequency bands utilized by various wireless communication systems, such as Bluetooth, WLAN, GSM, and/or CDMA, for example.

The digital baseband processor 129 may comprise suitable logic, circuitry, and/or code that may enable processing and/or handling of baseband signals. In this regard, the digital baseband processor 129 may process or handle signals received from the RF receiver 123a and/or signals to be transferred to the RF transmitter 123b for transmission via a wireless communication medium. The digital baseband processor 129 may also provide control and/or feedback information to the RF receiver 123a and to the RF transmitter 123b, based on information from the processed signals. The digital baseband processor 129 may communicate information and/or data from the processed signals to the processor 125 and/or to the memory 127. Moreover, the digital baseband processor 129 may receive information from the processor 125 and/or to the memory 127, which may be processed and transferred to the RF transmitter 123b for transmission to the wireless communication medium.

The RF transmitter 123b may comprise suitable logic, circuitry, and/or code that may enable processing of RF signals for transmission. The RF transmitter 123b may enable transmission of RF signals in frequency bands utilized by various wireless communications systems, such as GSM and/or CDMA, for example.

The processor 125 may comprise suitable logic, circuitry, and/or code that may enable control and/or data processing operations for the mobile terminal 120. The processor 125 may be utilized to control at least a portion of the RF receiver 123a, the RF transmitter 123b, the digital baseband processor 129, and/or the memory 127. In this regard, the processor 125 may generate at least one signal for controlling operations within the mobile terminal 120.

The memory 127 may comprise suitable logic, circuitry, and/or code that may enable storage of data and/or other information utilized by the mobile terminal 120. For example, the memory 127 may be utilized for storing processed data generated by the digital baseband processor 129 and/or the processor 125. The memory 127 may also be utilized to store information, such as configuration information, that may be utilized to control the operation of at least one block in the mobile terminal 120. For example, the memory 127 may comprise information necessary to configure the RF receiver 123a to enable receiving RF signals in the appropriate frequency band.

Figure 1B:
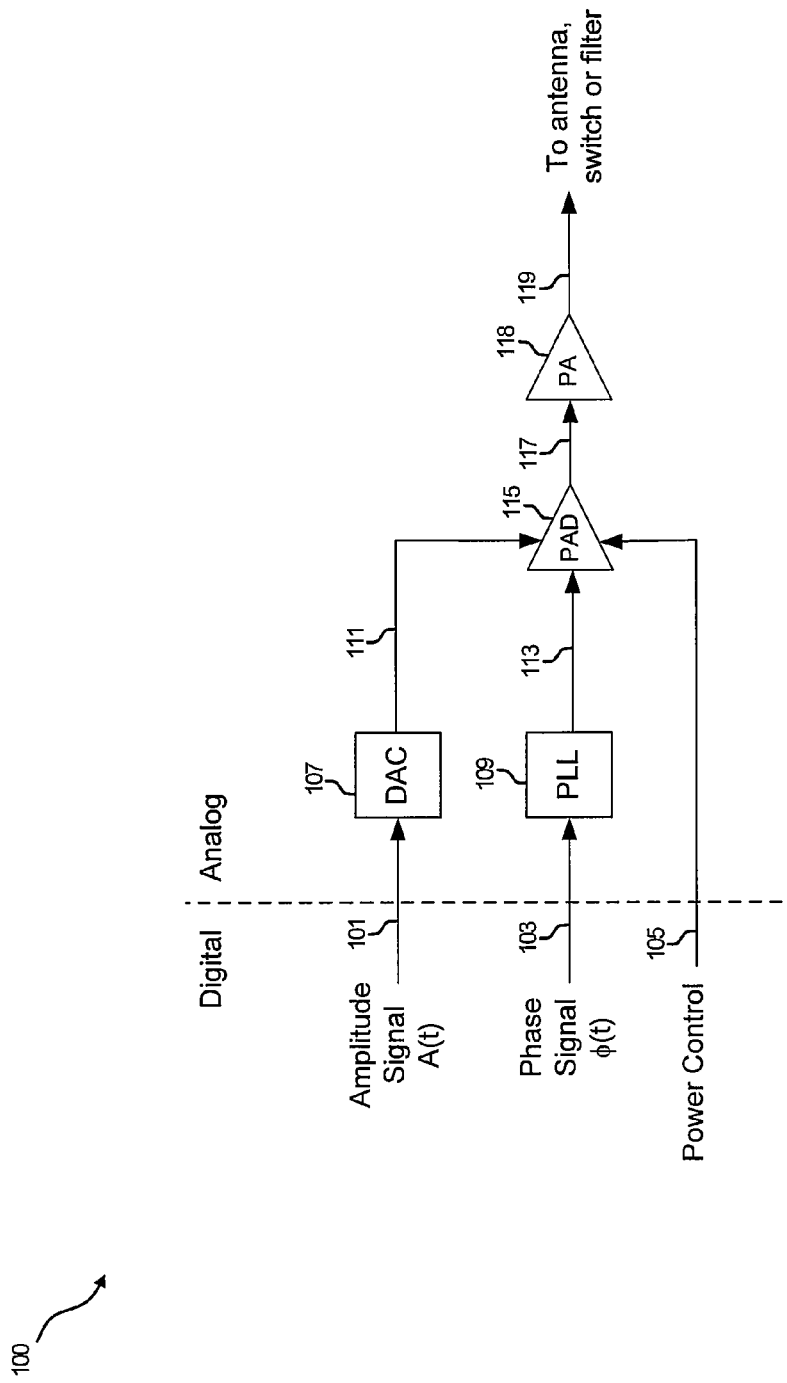
FIG. 1B is a block diagram of an exemplary polar transmitter, in accordance with an embodiment of the invention.

FIG. 1B is a block diagram of an exemplary polar transmitter, in accordance with an embodiment of the invention. Referring to FIG. 1B, there is shown a polar transmitter comprising a digital to analog converter (DAC) 107, a phase locked loop (PLL) 109, a power amplifier driver (PAD) 115, and a power amplifier (PA) 118. The exemplary polar transmitter 100 of FIG. 1B may be representative of the RF transmitter 123b of FIG. 1A.

The DAC 107 may comprise suitable circuitry, logic and/or code for converting an incoming digital signal to an analog output. The DAC 107 may be enabled to receive an input signal, namely, amplitude signal A(t) 101. The DAC 107 may be enabled to generate an output signal 111 which may be communicated to an input of the PAD 115.

The PLL 109 may comprise suitable circuitry, logic and/or code for generating an analog output signal in relation to a digital input signal. The PLL 109 may be enabled to receive an input signal, namely phase signal φ(t) 103. The PLL 109 may be enabled to generate an output signal 113, which may be communicated to an input of the PAD 115.

The PAD 115 may comprise suitable circuitry, logic and/or code for receiving digital and analog input signals and generating an output signal for driving a power amplifier. The PAD 115 may be enabled to receive an input power control signal 105. Additionally, the PAD 115 may be enabled to receive as input signals, the output signal 113 generated by the PLL 109 and the output signal 111 generated by the DAC 107.

The PA 118 may comprise suitable circuitry, logic and/or code for receiving an input signal and generating an amplified output signal. The PA 118 may be enabled to receive an input signal 117 generated by the PAD 115. The PA 118 may be enabled to generate a signal that may be communicated to an antenna, switch or filter.

In operation, the amplitude signal A(t) 101 may be communicated to the input of the DAC 107 where it may be converted to an analog signal 111. The analog signal 111 may be communicated to an input of the PAD 115. The phase signal φ(t) 103 may be communicated to the input of the PLL 109 where it may be converted to a signal which may be expressed using the following relationship:

$$\cos[\omega_c t + \phi(t)]$$

where $\omega_c$ is the angular frequency of the PLL 109.

The amplitude signal A(t) 101 and the phase signal φ(t) 103 may comprise the two components of a polar signal. The power control 105 may be communicated to another input of the PAD 115. The power control 105 may be a digital code utilized for controlling the gain in the PAD 115. The PAD 115 may receive the output signals of the DAC 107 and the PLL 113 and generate a signal which may be expressed using the following relationship:

$$A(t) * \cos[\omega_c t + \phi(t)].$$

The signal described by the above relationship may represent a polar signal 117 for communicating to the power amplifier 118. The amplitude of the polar signal 117 may be adjusted utilizing the power control 105. The power amplifier 119 may receive the polar signal 117 and generate an output signal 119 proportional to a product of the gain of the PA 118 and the polar signal 117. The output signal 119 may be communicated to an antenna for transmission, to a switch, or to a filter.

Figure 2:
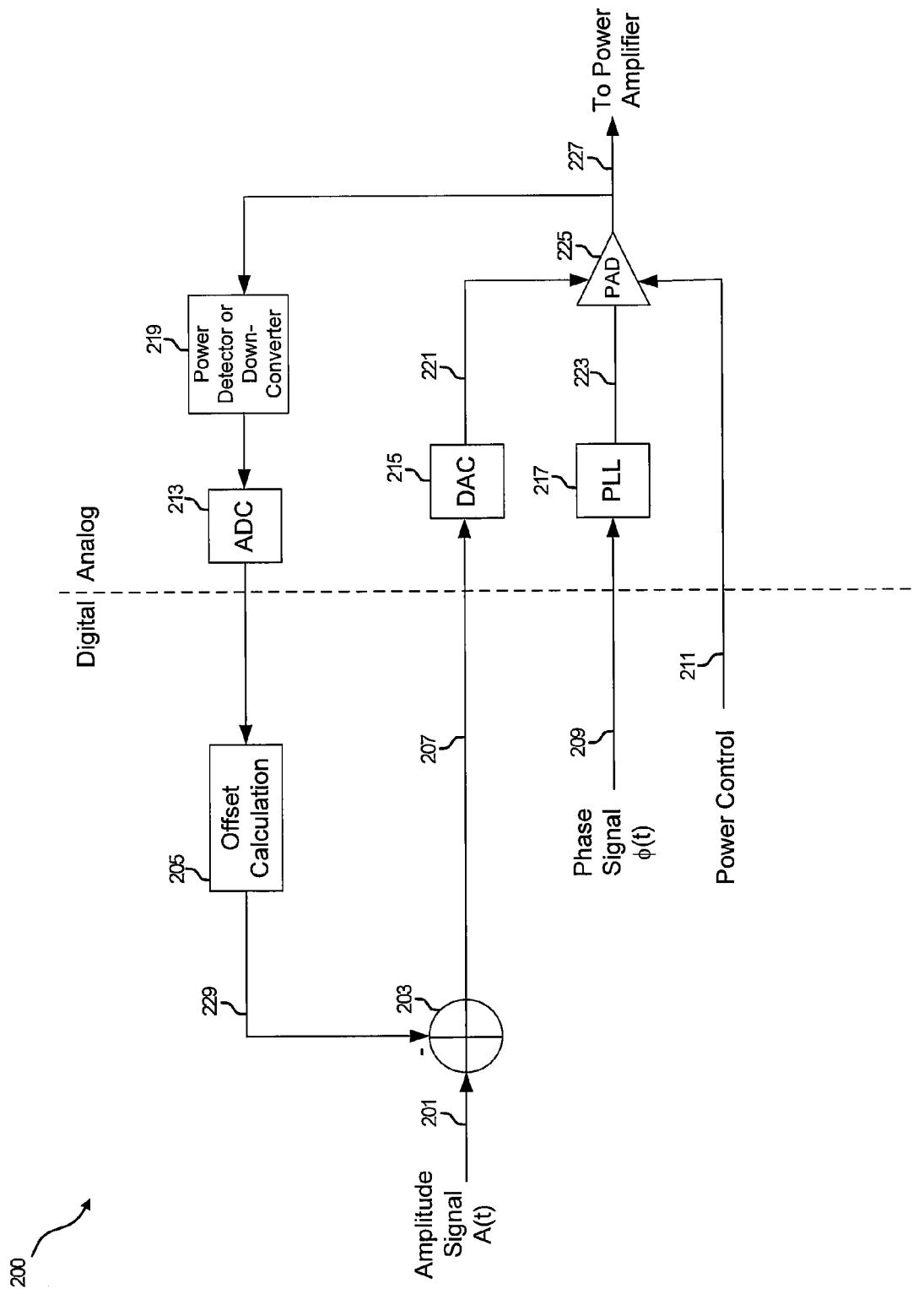
FIG. 2 is a block diagram of an exemplary power amplifier driver system, in accordance with an embodiment of the invention.

FIG. 2 is a block diagram of an exemplary power amplifier driver system, in accordance with an embodiment of the invention. Referring to FIG. 2, there is shown power amplifier driver system 200 comprising an adder 203, an offset calculation block 205, an analog to digital converter (ADC) 213, a DAC 215, a PLL 217, a power amplifier driver 225 and a power detector or down-converter block 219.

The adder 203 may comprise suitable circuitry, logic and/or code for summing digital signals. The adder 203 may be enable to receive an input amplitude signal A(t) and combine it with an input signal 229, which may be generated by the offset compensation block 205. A resulting output signal 207 generated by the adder block 203 may be communicated to the DAC 215.

The offset calculation block 205 may comprise suitable circuitry, logic and/or code for calculating a suitable offset signal, which may be utilized to reduce phase feedthrough in the power amplifier driver system 200. The offset calculation block 205 may be enabled to receive a digital output from the ADC 213, and accordingly, generate an output signal, namely offset $A_A$ 229. The offset $A_A$ 229 generated by the offset calculation block 205 may be communicated to a negative input of the adder 203.

The ADC 213 may comprise suitable circuitry, logic and/or code for converting an analog input signal to a digital output signal. The ADC 213 may be enabled to receive an output signal generated by power detector or down-converter block 219. The ADC 213 may be enabled to generate a digital output signal to be communicated to the offset calculation block 205.

The power detector or down-converter block 219 may comprise suitable circuitry, logic and/or code for detecting a power level of a signal or down-converting the signal to IF. The power detector or down-converter block 219 may be enabled for receiving an output signal 227 generated by the PAD 225, and accordingly generating an output signal proportional to the power level of the PAD 225 output signal 227 or down-converted to IF, which may be communicated to an input of the ADC 213.

The DAC 215 may comprise suitable circuitry, logic and/or code for converting a digital input signal to an analog output signal. The DAC may be enabled to receive an output signal generated by the adder 203, and accordingly generate an analog output signal, which may be communicated to an input of the PAD 225.

The PLL 217 may comprise suitable circuitry, logic and/or code for generating an analog output signal in relation to a digital input signal. The PLL 217 may be enabled to receive an input phase signal φ(t) 209 and may generate an output signal 223, which may be communicated to an input of the PAD 225.

The PAD 225 may comprise suitable circuitry, logic and/or code for receiving digital and analog input signals and generating an output signal for driving a power amplifier. The PAD 215 may be enabled to receive an input power control signal 211. Additionally, the PAD 215 may be enabled to receive as input signals, the output signal 223 generated by the PLL 217 and the output signal 221 generated by the DAC 215.

In operation, the amplitude signal A(t) 201 may be communicated to the adder 203 where it may be summed with an offset signal 229, which may be calculated by the offset calculation block 205, to reduce phase feedthrough described in further detail below. The phase signal φ(t) 209 may be communicated to the input of the PLL 217 where it may be converted to a signal proportional to the following relation:

$$\cos[\omega_c t + \phi(t)].$$

The amplitude signal A(t) 201 and the phase signal φ(t) 209 may comprise the two components of a polar signal. The power control signal 211 may be communicated to another input of the power amplifier driver 225. The power control signal 211 may be an n-bit digital code, which may be generated by the processor 125, utilized for controlling the gain or attenuation in the power amplifier driver 225. The power amplifier driver 225 may receive the output signals of the DAC 215 and the PLL 217 and generate a signal proportional to the following relation:

$$A(t) * \cos[\omega_c t + \phi(t)].$$

The signal given by the above relation may be the desired signal to be generated by the power amplifier driver 225. However, any variation in the amplitude signal A(t), $A_0$, such that the signal may be A(t)+$A_0$, may cause phase feedthrough, which may be expressed by the following equation:

$$[A(t)+A_0]*\cos[\omega_c t+\phi(t)] = A(t)*\cos[\omega_c t+\phi(t)] + A_0*\cos[\omega_c t+\phi(t)]$$

The second term on the right side of the equation above may be considered phase feedthrough and may degrade the signal to be transmitted. The phase feedthrough signal, $A_0 * \cos[\omega_c t + \phi(t)]$, may be reduced by subtracting an offset generated by the offset calculation block 205 to the amplitude signal A(t) 201 at the adder 203. The offset generated by the offset calculation block, $A_A$, may be determined to offset the variation, $A_0$, in the signal 221 communicated to the power amplifier driver 225, such that resulting signal 221 may be expressed by the following equation:

$$A(t) - A_A + A_0$$

In instances where the signal given by the equation above may be communicated to the power amplifier driver 225 along with the output of the PLL 217, phase signal 223, an output signal 227 of the power amplifier driver 225 given by the following relation may result:

$$[A(t) - A_A + A_0] * \cos[\omega_c t + \phi(t)] = A(t) * \cos[\omega_c t + \phi(t)]$$

since $A_A = A_0$. The calculation of $A_A$ is described further in FIG. 3.

Figure 3:
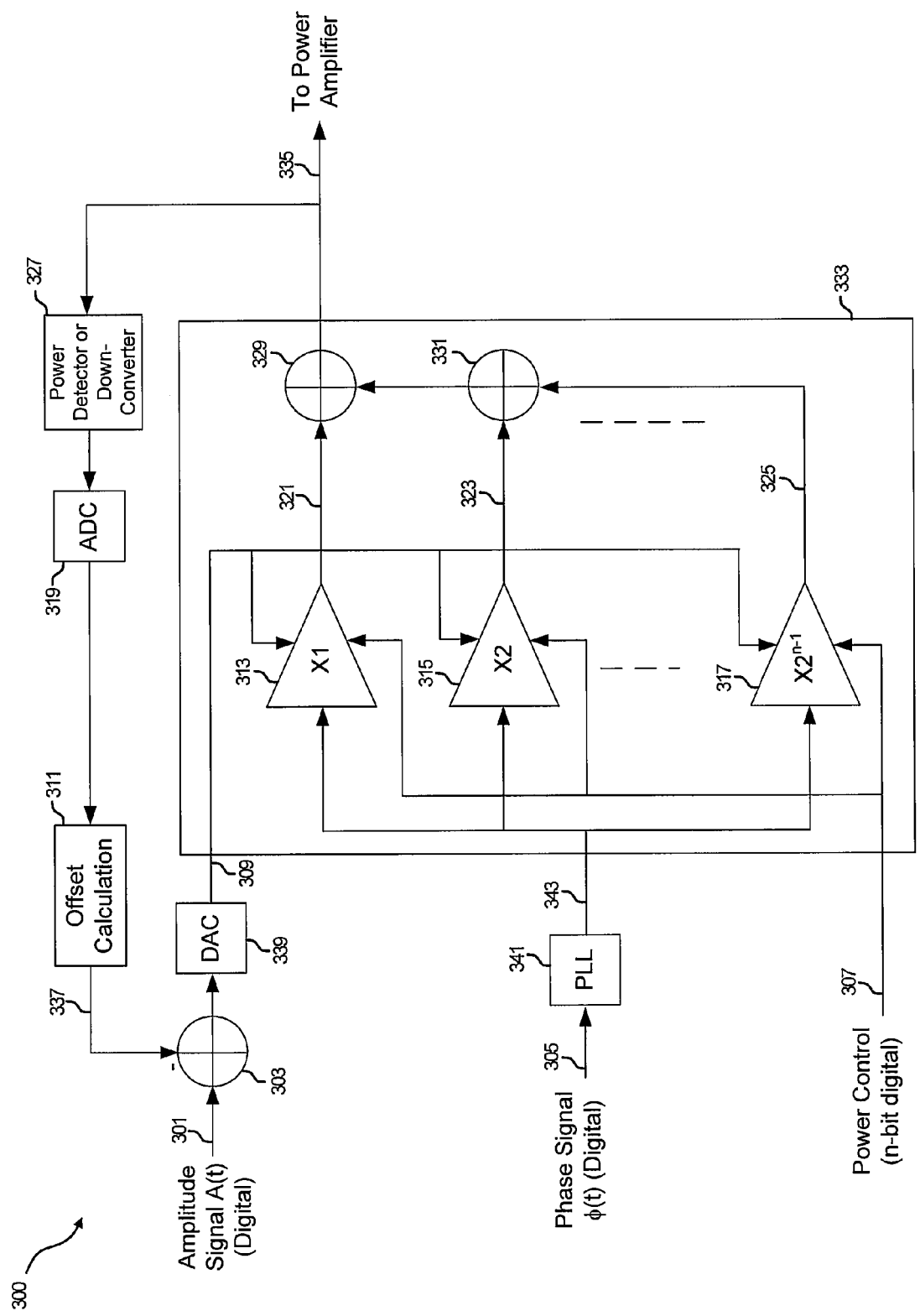
FIG. 3 is a block diagram of an exemplary power amplifier driver system with a detailed schematic of the power amplifier driver, in accordance with an embodiment of the invention.

FIG. 3 is a block diagram of an exemplary power amplifier driver system with a detailed schematic of the power amplifier driver, in accordance with an embodiment of the invention. Referring to FIG. 3, there is shown a PAD system 300 comprising an adder 303, an offset calibration block 311, an ADC 319, a power detector or down-converter block 327, a DAC 339, a PLL 341 and a PAD 333. The power amplifier block 333 may comprise a number, n, of binary-weighted cells with only the first two and the last binary-weighted cells shown 313, 315 and 317, and only the first two adders shown 329 and 331, with the variable number of binary-weighted cells and adders not shown being indicated by the vertical dashed lines.

The adder 303 may comprise suitable circuitry, logic and/or code for summing digital signals. The adder 303 may be enabled to receive an input amplitude signal A(t) 301 and combine it with an input signal 337, which may be generated by the offset compensation block 311. A resulting output signal generated by the adder block 303 may be communicated to the DAC 339.

The offset calculation block 311 may comprise suitable circuitry, logic and/or code for calculating an offset signal for reducing phase feedthrough in the PAD system 300. The offset calculation block 311 may be enabled to receive a digital output from the ADC 319, and accordingly, generate an output signal, namely offset $A_A$ 337. The offset $A_A$ 337 generated by the offset calculation block 311 may be communicated to a negative input of the adder 303.

The ADC 319 may comprise suitable circuitry, logic and/or code for converting an analog input signal to a digital output signal. The ADC 319 may be enabled to receive an output signal generated by power detector or down-converter block 327. The ADC 319 may be enabled to generate a digital output signal to be communicated to the offset calculation block 311.

The power detector or down-converter block 327 may comprise suitable circuitry, logic and/or code for detecting a power level of a signal or down-converting the signal to IF. The power detector or down-converter block 327 may be enabled to receive an output signal 335 generated by the PAD 333, and accordingly generate an output signal proportional to the power level of the PAD 333 output signal 335 or down-converted to IF, which may be communicated to an input of the ADC 319.

The DAC 339 may comprise suitable circuitry, logic and/or code for converting a digital input signal to an analog output signal. The DAC may be enabled to receive an output signal generated by the adder 303, and accordingly generate an analog output signal 309, which may be communicated to an input of each binary-weighted cell 313, 315, . . . , 317.

The PLL 341 may comprise suitable circuitry, logic and/or code, which may be enabled to generate an analog output signal in relation to a digital input signal. The PLL 341 may be enabled to receive an input phase signal $\phi(t)$ 305 and may generate an output signal 343, which may be communicated to an input of each binary-weighted cell 313, 315, . . . , 317.

The PAD 333 may comprise suitable circuitry, logic and/or code, which may be enabled to receive digital and analog input signals and generate an output signal for driving a power amplifier. The PAD 333 may be enabled to receive an input to each of the binary-weighted cells 313, 315, . . . , 317, the power control signal 307, which may comprise an n-bit word that may be generated by the processor 125. Additionally, the PAD 333 may be enabled to receive as input signals to each of the binary-weighted cells 313, 315, . . . , 317 the output signal 343 generated by the PLL 341 and the output signal 309 generated by the DAC 339.

In operation, the power control signal 307 may activate the appropriate binary-weighted cells for a desired gain level of the power amplifier driver 333. In the exemplary case where n=8, the ×1 binary-weighted cell may be activated in instances where the power control signal 307 may be given by 0000 0001, and the ×128 binary-weighted cell may be activated in instances where the power control signal 307 may be given by 1000 0000. In this manner, the power output of the power amplifier driver 333 may be controlled by enabling an appropriate number of binary-weighted cells, based on the power level of each binary-weighted cell, $1\times, 2\times, 4\times \ldots 2^{n-1}\times$. The output power of the power amplifier driver 333 may be represented by the following equation:

$$\text{Output Power} = \sum_{k=0}^{n-1} PC<k> \cdot 2^k \cdot P_{out,X1}$$

where PC<k> may equal 1 in instances where the k-th binary-weighted cell may be enabled and may equal 0 in instances where the k-th binary-weighted cell may be disabled, and $P_{out,x1}$ may equal the power output of the ×1 binary-weighted cell 313. The ×2 binary-weighted cell 315 may have an output power twice that of the ×1 binary-weighted cell 313, and so on, up to the $\times 2^{n-1}$ binary-weighted cell.

As described with respect to FIG. 2, the variation in the amplitude signal 309, may be offset by subtracting an offset, $A_A$ 337 at the adder 303, such that the amplitude signal 309 may be represented as $A(t) + A_0 - A_A$. Thus, to generate an amplitude signal 309 that may be the desired signal A(t), the offset $A_A$ 337 may be calibrated to equal $A_0$ for each power level. However, a power amplifier driver may have a large number of desired power levels, 255, for example with eight binary-weighted cells, which may require excessive time for calibration during system power up and/or power level adjustment. Thus, it may be desirable, for phase feedthrough reduction at $2^n$ power levels, to measure and calibrate offsets for n power levels, and calculate the remaining offsets.

In an exemplary embodiment of the invention, a first step may be to determine the offsets $\Delta_k$, of each binary-weighted cell, where k may equal 0 to n−1. The $\Delta_k$ terms may be determined by a calibration procedure, which may be performed at system startup, for example. For the calibration of $\Delta_1$, the first binary-weighted cell 313 may be enabled with the remaining binary-weighted cells disabled.

TABLE 1

| Code | X1 | X2 | X4 | X8 | X16 | X32 | X64 | X128 |
|------|----|----|----|----|-----|-----|-----|------|
| 00000001 | E | D | D | D | D | D | D | D |
| 00000010 | D | E | D | D | D | D | D | D |
| 00000100 | D | D | E | D | D | D | D | D |
| 00001000 | D | D | D | E | D | D | D | D |
| 00010000 | D | D | D | D | E | D | D | D |
| 00100000 | D | D | D | D | D | E | D | D |
| 01000000 | D | D | D | D | D | D | E | D |
| 10000000 | D | D | D | D | D | D | D | E |

E = Enabled,
D = Disabled

The processor 125 may be utilized to generate the power control signal 307. Chart 1 illustrates the binary-weighted cell activation scheme for the calibration of the binary-weighted cell offsets in the exemplary case where n may equal 8. In the case where the k-th binary-weighted cell may be activated and calibrated, the remaining binary-weighted cells may be disabled.

With a binary-weighted cell activated, an amplitude signal A(t) 301 may be set to zero and the output signal 335 may be fed back for offset calculation via the power detector or downconverter block 327, the ADC 319, and the offset calculation block 311. The output of the offset calculation block 311, $A_\Delta$ 337, may be adjusted until the output signal 335 is reduced to approximately zero. The resulting $A_\Delta$ in this instance may be represented as $A_0$. This procedure may be repeated for each of the n binary-weighted cells 315, ..., 317 to obtain values for $\Delta_1, \ldots \Delta_{n-1}$. These values may be stored in an n-bit lookup table.

The offset calculation for a required power level as indicated by the power control signal 307 may be performed utilizing the following equation:

$$A_\Delta = \frac{\sum_{k=0}^{n-1} \Delta_k \cdot 2^k \cdot PC<n>}{PC}$$

where PC may represent the power control signal 307, which may comprise an n-bit word that may be generated by the processor 125, and PC<n> may equal 1 in instances where the power control signal 307 indicates a binary-weighted cell may be enabled or 0 in instances where the power control signal 307 indicates a binary-weighted cell may be disabled. The multiplication by $2^k$ may be performed by a bit shift operation, simplifying the calculation. The equation above generates a weighted sum of the calibrated offsets of each enabled binary-weighted cell divided by the power control signal 307. In this manner, the phase feedthrough may be cancelled utilizing a fast calibration of n power levels, as opposed to calibrating $2^n$ power levels of the power amplifier driver 333.

Figure 4:
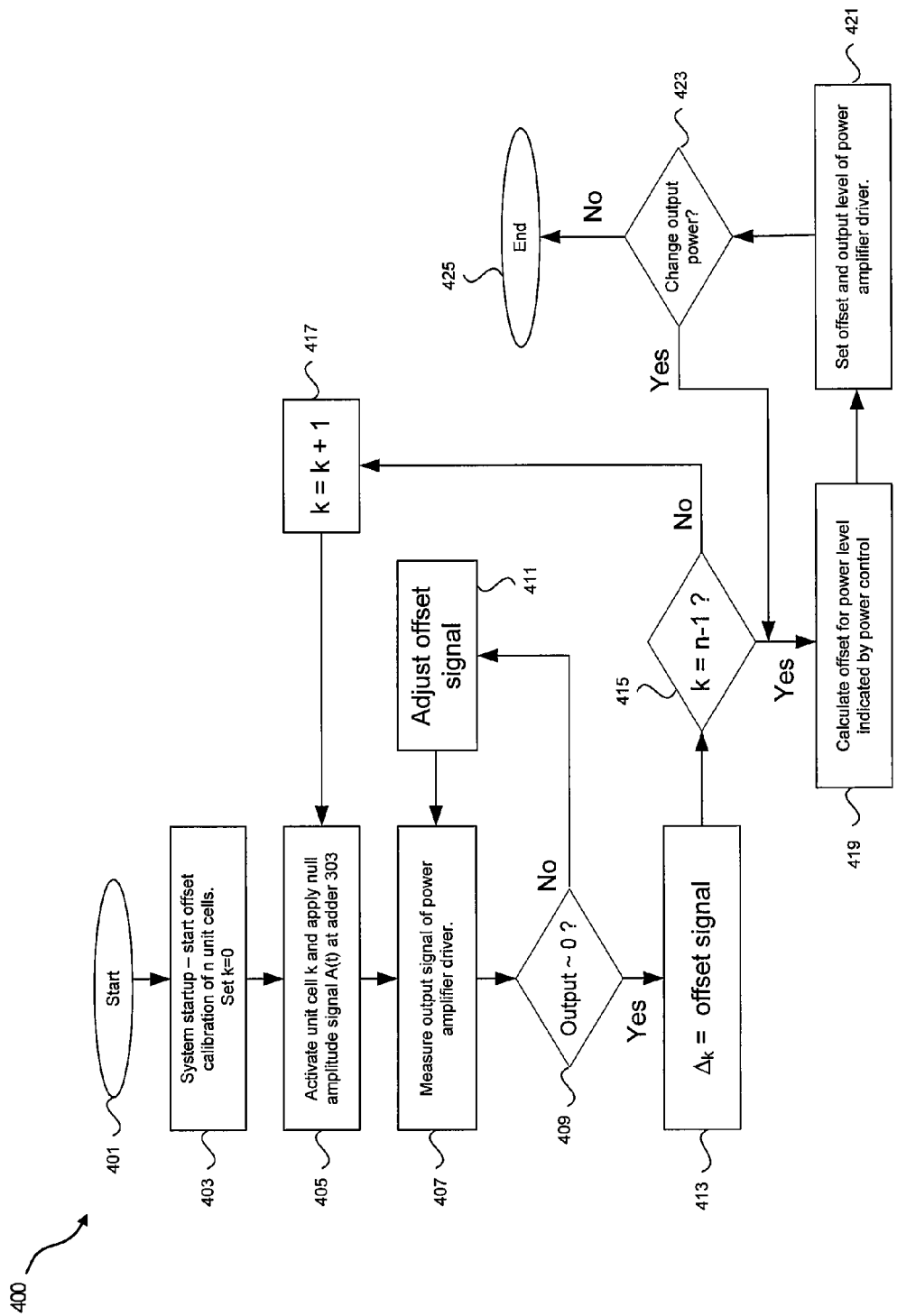
FIG. 4 is a flow diagram illustrating exemplary steps for a power amplifier driver calibration and control process, in accordance with an embodiment of the invention.

FIG. 4 is a flow diagram illustrating exemplary steps for a power amplifier driver calibration and control process, in accordance with an embodiment of the invention. Referring to FIG. 4, there is shown a flow diagram 400. After start step 401, in step 403 at system startup, an offset calibration may begin with k=1. In step 405, the k-th binary-weighted cell may be activated and a null amplitude signal may be communicated to adder 303. In step 407, the output signal 335 of the power amplifier driver 333 may be measured. In step 409, when the output signal 335 may be approximately zero, the process may proceed to step 413 where the offset $\Delta_k$ may be equal to the current output signal 335 of the offset calibration block 311. However, when the output signal 335 may not be approximately zero, the process proceeds to step 411 where the offset signal may be adjusted and then proceeds to step 407. This loop continues until the output signal of power amplifier driver 335 may be approximately zero. In step 415, when the variable k may not be equal to n−1, where n is the number of binary-weighted cells, the process proceeds to step 417 where k increments by 1 and proceeds again to step 405 to repeat the calibration process for the next binary-weighted cell. In step 415, when k may be equal to n−1, the process then proceeds to step 419 where an offset is calculated for the power amplifier driver 333 output power level indicated by power control signal 307. The output power level of the power amplifier driver 333 and the calculated offset may be set in the power amplifier driver 333 in step 421. In step 423, in instances where a different power level is indicated by the power control signal 307, the process may proceed to step 419 to again calculate the required offset for the indicated power level. However, if in step 423 no power level change is indicated by the power control signal 307, the process proceeds to the end step 425.

In an embodiment of the invention, a method, system and machine-readable code are described for individually activating each of n binary-weighted cells utilizing a control signal 307 in a power amplifier driver (PAD) 333 and measuring the output signal 335, or offset, in response to a null signal applied to an input of the PAD 333. This offset may be fed back, summed, and adjusted until the measured PAD output 335 may be minimized or as small as possible. This calibrated offset may cancel phase feedthrough of the PAD 333, and the calibrated offset for each binary-weighted cell may be stored in a lookup table. The control signal 307 may also be utilized for controlling the output power of the PAD 333 by activating appropriate binary-weighted cells. For each of the $2^n$ output powers, a calibrated offset is calculated utilizing a weighted sum of the stored offsets for the activated binary-weighted cells.

Certain embodiments of the invention may comprise a machine-readable storage having stored thereon, a computer program having at least one code section for communicating information within a network, the at least one code section being executable by a machine for causing the machine to perform one or more of the steps described herein.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for calibrating and using a circuit, the method comprising:
    in a power amplifier driver (PAD) comprising n binary-weighted cells, individually activating each of said n binary-weighted cells, one at a time, utilizing a control signal, and wherein n is an integer;
    responsive to an input signal applied to an input of each of said individually activated n binary-weighted cells, measuring corresponding output signals generated at an output of said PAD to determine an offset; and
    for each of said individually activated n binary-weighted cells, feeding back and adjusting said determined offset to an input of said PAD until a measured output of said PAD is minimized.

2. The method according to claim 1, comprising combining said fed back determined offset with a zero input of said PAD.

3. The method according to claim 1, wherein said adjusted offset cancels a phase feedthrough of said PAD.

4. The method according to claim 1, wherein said control signal is also utilized for controlling an output power of said PAD.

5. The method according to claim 1, comprising for each of said individually activated n binary-weighted cells, storing in a lookup table said adjusted offset that causes said output of said PAD to be minimized.

6. The method according to claim 5, comprising determining an output power level of said PAD based on a number of said n binary-weighted cells activated by said control signal.

7. The method according to claim 6, comprising calculating an offset for said output power level of said PAD based on at least said stored adjusted offset for said number of said n binary-weighted cells activated by said control signal.

8. The method according to claim 6, comprising calculating an offset for said output power level of said PAD based on a weighted sum of said stored adjusted offset for said number of said n binary-weighted cells activated by said control signal.

9. The method according to claim 6, comprising calculating said output power level of said PAD utilizing the following equation:

$$\frac{\sum_{k=0}^{n-1} 2^k \Box pc<k> \Box \Delta_k}{pc}$$

where $pc<k>$ is equal to 1 if a k-th binary-weighted cell is activated or is equal to 0 if a k-th binary-weighted cell is not activated, pc is said control signal, and $\Delta_k$ is said stored adjusted offset of the k-th binary-weighted cell in said lookup table.

10. The method according to claim 1, wherein a number of possible output levels of said PAD is $2^n$.

11. A system for calibrating and using a circuit, the system comprising: a power amplifier driver (PAD) comprising n binary-weighted cells, said n binary-weighted cells being individually activated one at a time utilizing a control signal, and wherein n is an integer;
    one or more circuits responsive to an input signal applied to an input of each of said individually activated n binary-weighted cells, said one or more circuits measuring corresponding output signals generated at an output of said PAD to determine an offset; and
    said one or more circuits, for each of said individually activated n binary-weighted cells, feeding back and adjusting said determined offset to an input of said PAD until a measured output of said PAD is minimized.

12. The system according to claim 11, comprising one or more circuits for combining said fed back determined offset with a zero input of said PAD.

13. The system according to claim 11, comprising one or more circuits for canceling a phase feedthrough of said PAD utilizing said adjusted offset.

14. The system according to claim 11, comprising one or more circuits for controlling an output power of said PAD utilizing said control signal.

15. The system according to claim 11, comprising one or more circuits for storing in a lookup table for each of said individually activated n binary-weighted cells, said adjusted offset that causes said output of said PAD to be minimized.

16. The system according to claim 15, comprising one or more circuits for determining an output power level of said PAD based on a number of said n binary-weighted cells activated by said control signal.

17. The system according to claim 16, comprising one or more circuits for calculating an offset for said output power level of said PAD based on at least said stored adjusted offset for said number of said n binary-weighted cells activated by said control signal.

18. The system according to claim 16, comprising one or more circuits for calculating an offset for said output power level of said PAD based on a weighted sum of said stored adjusted offset for said number of said n binary-weighted cells activated by said control signal.

19. The system according to claim 16, comprising one or more circuits for calculating said output power level of said PAD utilizing the following equation:

$$\frac{\sum_{k=0}^{n-1} 2^k \square pc<k> \square \Delta_k}{pc}$$

where pc<k> is equal to 1 if a k-th binary-weighted cell is activated or is equal to 0 if a k-th binary-weighted cell is not activated, pc is said control signal, and $\Delta_k$ is said store adjusted offset of the k-th binary-weighted cell in said lookup table.

20. The system according to claim 11, comprising one or more circuits wherein a number of possible output levels of said PAD is $2^n$.

21. A machine-readable storage medium having stored thereon, a computer program having at least one code section for calibrating and using a circuit, the at least one code section being executable by a machine for causing the machine to perform steps comprising:

in a power amplifier driver (PAD) comprising n binary-weighted cells, individually activating each of said n binary-weighted cells, one at a time, utilizing a control signal, and wherein n is an integer;

responsive to an input signal applied to an input of each of said individually activated n binary-weighted cells, measuring corresponding output signals generated at an output of said PAD to determine an offset;

for each of said individually activated n binary-weighted cells, feeding back and adjusting said determined offset to an input of said PAD until a measured output of said PAD is minimized.

22. The machine readable storage medium according to claim 21, wherein said at least one code section comprises code for combining said fed back determined offset with a zero input of said PAD.

23. The machine readable storage medium according to claim 21, wherein said at least one code section comprises code for canceling a phase feedthrough of said PAD utilizing said adjusted offset.

24. The machine readable storage medium according to claim 21, wherein said at least one code section comprises code for controlling an output power of said PAD utilizing said control signal.

25. The machine readable storage medium according to claim 21, wherein said at least one code section comprises code for storing in a lookup table for each of said individually activated n binary-weighted cells, said adjusted offset that causes said output of said PAD to be minimized.

26. The machine readable storage medium according to claim 25, wherein said at least one code section comprises code for determining an output power level of said PAD based on a number of said n binary-weighted cells activated by said control signal.

27. The machine readable storage medium according to claim 26, wherein said at least one code section comprises code for calculating an offset for said output power level of said PAD based on at least said stored adjusted offset for said number of said n binary-weighted cells activated by said control signal.

28. The machine readable storage medium according to claim 26, wherein said at least one code section comprises code for calculating an offset for said output power level of said PAD based on a weighted sum of said stored adjusted offset for said number of said n binary-weighted cells activated by said control signal.

29. The machine readable storage medium according to claim 26, wherein said at least one code section comprises code for calculating said output power level of said PAD utilizing the following equation:

$$\frac{\sum_{k=0}^{n-1} 2^k * pc<k> * \Delta_k}{pc}$$

where pc<k> is equal to 1 if a k-th binary-weighted cell is activated or is equal to 0 if a k-th binary-weighted cell is not activated, pc is said control signal, and $\Delta_k$ is said stored adjusted offset of the k-th binary-weighted cell in said lookup table.

30. The machine readable storage medium according to claim 21, wherein said at least one code section comprises code wherein a number of possible output levels of said PAD is $2^n$.

* * * * *